(12) United States Patent
Hwang

(10) Patent No.: US 7,333,387 B2
(45) Date of Patent: Feb. 19, 2008

(54) DEVICE AND METHOD FOR SELECTING 1-ROW AND 2-ROW ACTIVATION

(75) Inventor: Hyong-Ryol Hwang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 18 days.

(21) Appl. No.: 11/428,497

(22) Filed: Jul. 3, 2006

(65) Prior Publication Data

US 2007/0014180 A1    Jan. 18, 2007

(30) Foreign Application Priority Data

Jul. 2, 2005    (KR) ............... 10-2005-0059482

(51) Int. Cl.
*G11C 7/00* (2006.01)

(52) U.S. Cl. .................. 365/230.03; 365/63

(58) Field of Classification Search .......... 365/230.03, 365/63, 230.01, 149
See application file for complete search history.

(56) References Cited

U.S. PATENT DOCUMENTS 6,170,036 B1 * 1/2001 Konishi et al. ............. 711/104
6,331,956 B1 * 12/2001 Ooishi et al. ............... 365/200
6,538,941 B2 * 3/2003 Noh ........................... 365/203

FOREIGN PATENT DOCUMENTS

| JP | 2000-150820 | 5/2000 |
| JP | 2001-101860 | 4/2001 |
| KR | 10-2003-0043410 | 6/2003 |

OTHER PUBLICATIONS

English language abstract of Japanese Publication No. 2000-150820.
English language abstract of Japanese Publication No. 2001-101860.
English language abstract of Korean Publication No. 10-2003-0043410.

* cited by examiner

*Primary Examiner*—Vu A. Le
(74) *Attorney, Agent, or Firm*—Marger Johnson & McCollom, P.C.

(57) ABSTRACT

I claim a device and method for selecting 1-row and 2-row activation. A device includes a memory block array including a plurality of memory blocks arranged in a row-column format, a plurality of local inter-connectors to selectively couple upper local lines to lower local lines in corresponding rows of memory blocks and a plurality of local-to-global connection points to selectively couple the upper and lower local lines to one or more global lines in at least an upper left block area and a lower right block area of the memory block array, or in a lower left block area and an upper right block area of the memory block array.

20 Claims, 4 Drawing Sheets

DEVICE AND METHOD FOR SELECTING 1-ROW AND 2-ROW ACTIVATION

CROSS-REFERENCE TO RELATED PATENT APPLICATION

This application claims priority from Korean Patent Application No. 10-2005-0059482, filed on Jul. 2, 2005, which we incorporate by reference.

BACKGROUND OF THE INVENTION

1. Field of the Invention

The present invention relates to a memory device, and more particularly, to configuring the memory device for a 1-row activation or a 2-row activation.

2. Description of the Related Art

As the storage capacity and operating speed of semiconductor memory devices, such as dynamic random access memories (DRAMs), increase, an increasing number of DRAMs have been developed with hierarchical input/output (I/O) line architectures. These hierarchical I/O lines architectures comprise pairs of local I/O lines and pairs of global I/O lines to quickly drive wordlines and enhance the speed of inputting/outputting data to/from semiconductor memory devices.

FIG. 1 is a diagram of a conventional semiconductor memory device 100 having a 1-row activation configuration. The semiconductor memory device 100 shown in FIG. 1 may be one eighth of a bank of a 512 M DRAM including a plurality of local I/O line pairs LIO11 through LIO15 and LIO21 through LIO25, a plurality of global I/O line pairs GIO<0> through GIO<3> and GIO<4> through GIO<7>, and a plurality of multiplexers LGM1 through LGM8 that connect the local I/O line pairs LIO11 through LIO15 and the global I/O line pairs GIO<0> through GIO<3> and connect the local I/O line pairs LIO21 through LIO25 and the global I/O line pairs GIO<4> through GIO<7>.

Each of the local I/O line pairs LIO11 through LIO15 and LIO21 through LIO25 corresponds to two memory blocks. For example, the local I/O line pair LIO11 corresponds to memory blocks MCB1 and MCB2, and the local I/O line pair LIO22 corresponds to memory blocks MCB3 and MCB4. The local I/O line pairs LIO11 and LIO12 each corresponding to memory blocks MCB1 and MCB2 are separate from the local I/O line pairs LIO21 and LIO22 each corresponding to memory blocks MCB3 and MCB4.

The semiconductor memory device 100 may operate at a X32 double data rate, where 64-bits of data is substantially simultaneously outputted. Since FIG. 1 may show one eighth of a bank of a 512M DRAM, the semiconductor memory device 100 may output 8-bit data at a time.

Each of the global I/O line pairs GIO<0> through GIO<7> may include a global I/O line and an inverted global I/O line to output 1-bit data. Each of the local I/O line pairs LIO11 through LIO15 and LIO21 through LIO25 may include a local I/O line and an inverted local I/O line to transmit 1-bit data.

When a wordline WL, which passes through the memory blocks MCB1 through MCB4, is activated, the multiplexers LGM1 through LGM8 on both sides of the memory blocks MCB1 through MCB4 are activated so that the local I/O line pairs LIO11, LIO12, LIO21, and LIO22 are connected to the global I/O line pairs GIO<0> through GIO<7>. Data may output from the memory blocks MCB1 through MCB4 via the local I/O line pairs LIO11, LIO12, LIO21, and LIO22 and the global I/O line pairs GIO<0> through GIO<7>.

A Joint Electron Device Engineering Council (JEDEC) has recently adopted a 2-row activation configuration as a standard for mobile DRAMs to enhance the speed of writing/reading data to/from a memory by simultaneously activating 2 wordlines. The 2-row activation configuration is a DRAM architecture in which 2 wordlines and a column selection line are simultaneously activated in a data write or read operation. Semiconductor memory devices, however, consume a considerable amount of current when activating 2 wordlines at the same time. To reduce this high current consumption problem, it may be advantageous to incorporate a 1-row activation configuration together with the 2-row activation configuration in a memory device.

The semiconductor memory device 100 has a 1-row activation configuration. Conventionally, semiconductor memory devices having a 1-row activation configuration are separate from semiconductor memory devices having a 2-row activation configuration.

As described above, semiconductor memory devices having a 1-row activation configuration are sometimes more advantageous than semiconductor memory devices having a 2-row activation configuration. Since the JEDEC has adopted a 2-row activation configuration as a standard for mobile DRAMs, however, the need remains for memory devices capable of selecting a 1-row activation configuration or a 2-row activation configuration.

SUMMARY OF THE INVENTION

Embodiments of the present invention provide memory devices capable of selecting a 1-row activation configuration or a 2-row activation configuration. A device includes a memory block array including a plurality of memory blocks arranged in a row-column format, a plurality of local interconnectors to selectively couple upper local lines to lower local lines in corresponding rows of memory blocks, and a plurality of local-to-global connection points to selectively couple the upper and lower local lines to one or more global lines in at least an upper left block area and a lower right block area of the memory block array, or in a lower left block area and an upper right block area of the memory block array.

BRIEF DESCRIPTION OF THE DRAWINGS

The features and advantages of the present invention will become more apparent with a detailed description of the exemplary embodiments referencing the attached drawings.

DETAILED DESCRIPTION OF THE INVENTION

Figure 1:
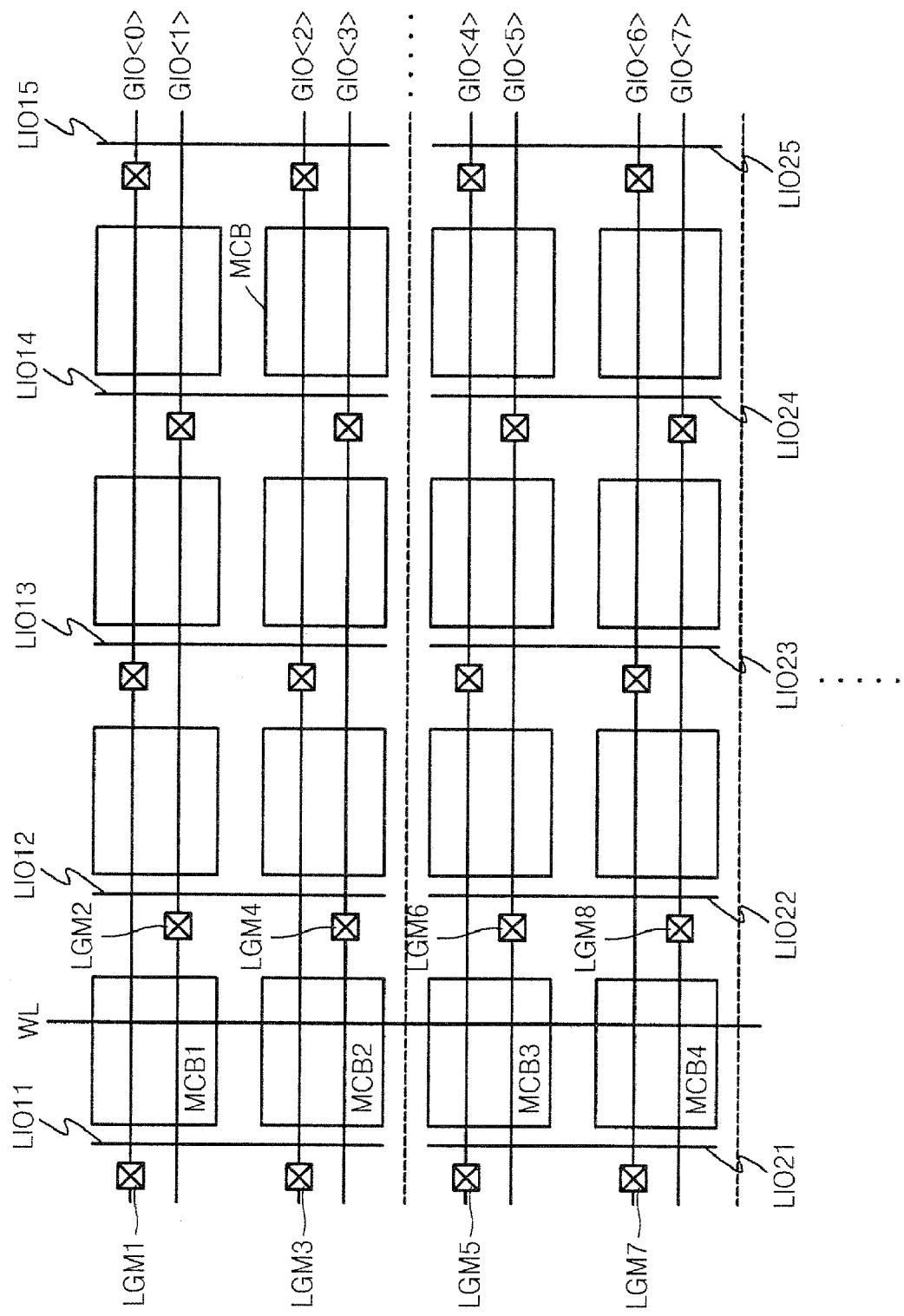
FIG. 1 is a diagram of a conventional semiconductor memory device having a 1-row activation configuration.
Figure 2:
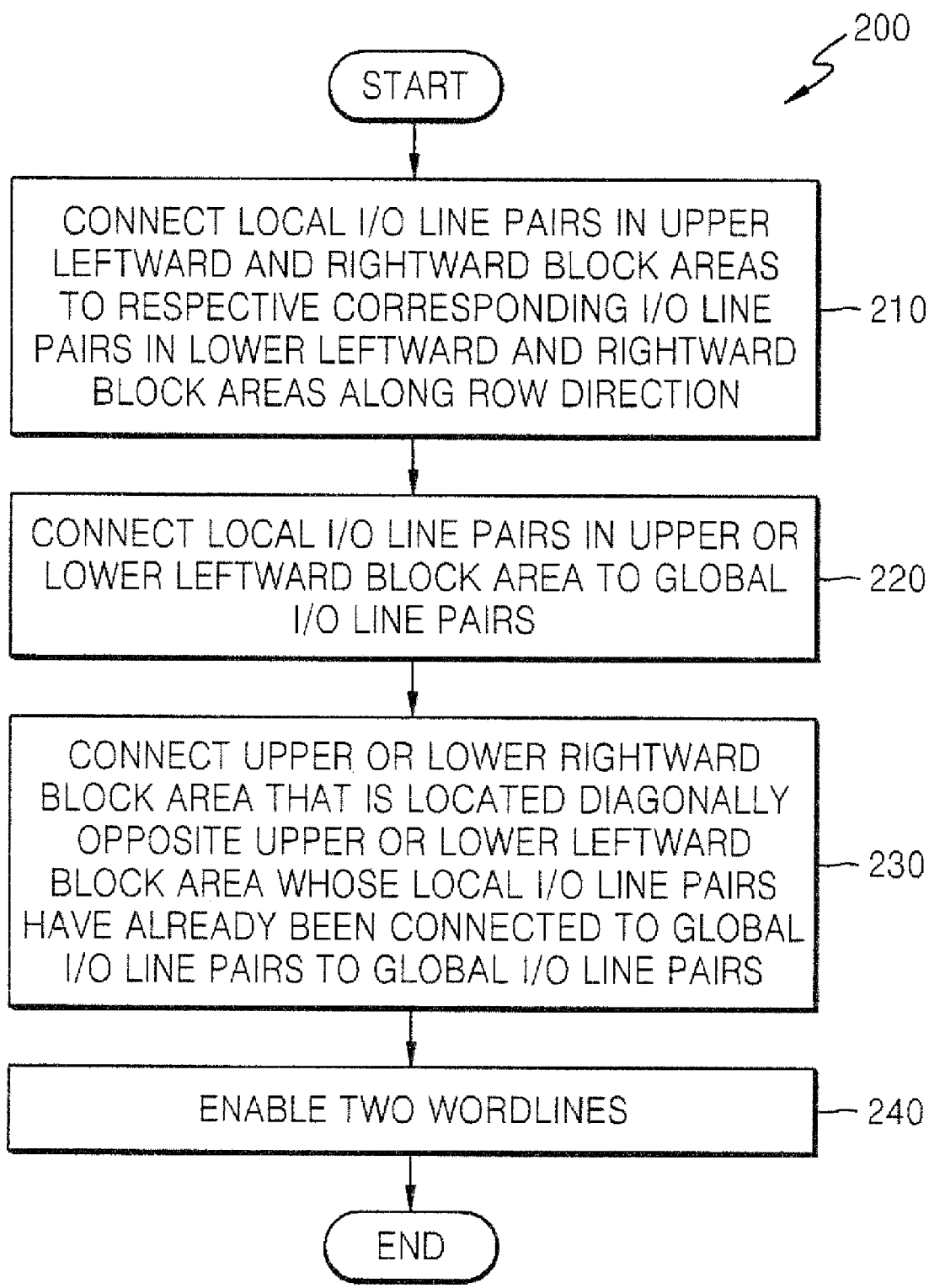
FIG. 2 is a flowchart for 2-row activation useful with embodiments of the present invention.
Figure 3:
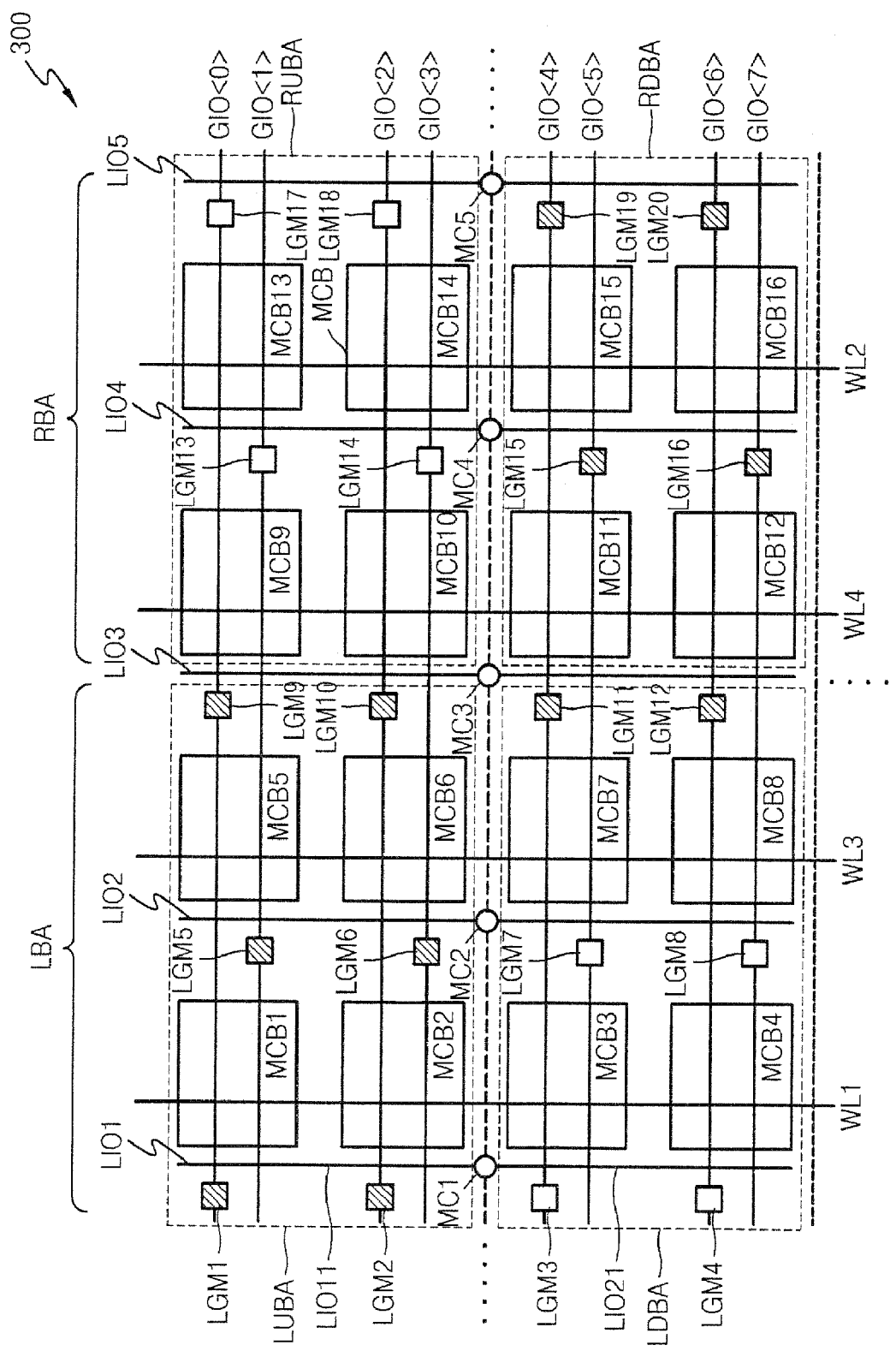
FIG. 3 is a diagram of a memory device useful with embodiments of the present invention.

FIG. 2 is a flowchart for 2-row activation useful with embodiments of the present invention, and FIG. 3 is a diagram of a memory device useful with embodiments of the present invention. Referring to FIGS. 2 and 3, the memory device 300 includes a plurality of memory blocks MCB1 through MCB16, which may be arranged in a matrix format. The memory blocks MCB1 through MCB16 may be classified as belonging to one of a leftward block area LBA and a rightward block area RBA. The leftward block area LBA may be divided into an upper leftward block area LUBA and a lower leftward block area LDBA, and the rightward block area RBA may be divided into an upper rightward block area RUBA and a lower rightward block area RDBA. The 2-row activation method 200 is performed by the semiconductor memory device 300 for selecting a 1-row activation configuration or a 2-row activation configuration.

FIG. 3 is a diagram of a memory device useful with embodiments of the present invention. Referring to FIG. 3, the memory device 300 may select a 1-row activation configuration or a 2-row activation configuration using metal options. The memory device 300 may include an upper leftward block area LUBA, a lower leftward block area LDBA, an upper rightward block area RUBA, and a lower rightward block area RDBA. The upper and lower leftward block areas LUBA and LDBA may constitute a leftward block area LBA, and the upper and lower rightward block areas RUBA and RDBA may constitute a rightward block area RBA. The number of memory blocks included in the leftward block area LBA may be the same as the number of memory blocks included in the rightward block area RBA.

The leftward block area LBA and the rightward block area RBA are on the left and right sides, respectively, of a local I/O line pair LIO3 and include memory blocks MCB1 through MCB8 and MCB9 through MCB16, respectively, which may be arranged in a matrix format.

Each of the global I/O line pairs GIO<0> through GIO<7> may comprise a global I/O line and an inverted global I/O line to output data, or a single line as shown in the drawing. Likewise, each of the local I/O line pairs LIO1 through LIO5 may comprise a local I/O line and an inverted local I/O line to transmit data, or a single line as shown in the drawing.

The memory device 300 includes a plurality of metal options. First metal options, or local inter-connectors, MC1 through MC5 may connect or disconnect local I/O line pairs located in the leftward and rightward block areas. The first metal options MC1 through MC5 may be metal contacts. The first metal options MC1 through MC5 may connect or disconnect local I/O line pairs along a row direction. For example, when the memory device 300 operates in 2-row activation mode, a first metal option MC1 connects local I/O line pair LIO11 to local I/O line pair LIO21 and makes them one local I/O line pair LIO1. However, when the memory device 300 operates in 1-row activation mode, the first metal option MC1 separates the local I/O line pair LIO11 MC1 from local I/O line pair LIO21.

When the semiconductor memory device 300 is switched from a 1-row activation configuration to a 2-row activation configuration, the number of word lines that can be activated at one time is doubled, and the number of column selection lines (CLS) (not shown) that can be activated at one time may be halved. In other words, in a 1-row activation configuration, 2 column selection lines are activated at a time, while in a 2-row activation configuration, 1 column selection line is activated at a time. Therefore, the length of a local I/O line pair used in a 2-row activation configuration may be twice the length of a local I/O line pair used in a 1-row activation configuration.

When the memory device 300 operates in 2-row activation mode, a plurality of local I/O line pairs located in the upper half of the memory device 300 are connected to respective corresponding local I/O line pairs located in the lower half of the memory device 300, forming the local I/O line pairs LIO1 through LIO5 that extend without disconnection in the memory device 300. In other words, the local I/O line pairs LIO1 through LIO5 extend along a row direction without disconnection from the top to the bottom of the memory device 300. When the memory device 300 operates in 1-row activation mode, local I/O line pair LIO11 is separated from local I/O line pair LIO21.

Second metal options or local-to-global connection points connect or disconnect local I/O line pairs to/from global I/O line pairs. The second metal options may be located between the local I/O line pairs and the global I/O line pairs. The second metal options may connect or disconnect the local I/O line pairs to the global I/O line pairs in either the upper leftward block area and lower rightward block area, or upper rightward block area and lower leftward block area. For example, when the memory device 300 operates in 2-row activation mode, the second metal options connect the local I/O line pairs LIO1, LIO2 to the global I/O line pairs GIO<4> through GIO<7> in the lower leftward block area. And the second metal options connect the local I/O line pairs LIO4, LIO5 to the global I/O line pairs GIO<0> through GIO<3> in the upper rightward block area. When the memory device 300 operates in 1-row activation mode, however, the second metal options disconnect the local I/O line pairs from the global I/O line pairs in the lower leftward and the upper rightward block areas.

The memory device 300 may include third metal options or local-to-global connection points located between the local I/O line pairs and the global I/O line pairs. The third metal options may connect or disconnect local I/O line pairs to/from global I/O line pairs in block areas not corresponding to the second metal options. For example, when the memory device 300 operates in 2-row activation mode, the third metal options may connect the local I/O line pairs LIO1, LIO2 to the global I/O line pairs GIO<0> through GIO<3> in the upper leftward block area, and connect the local I/O line pairs LIO4, LIO5 to the global I/O line pairs GIO<4> through GIO<7> in the lower rightward block area. In some embodiments, when the memory device 300 operates in 1-row activation mode, the third metal options may connect the local I/O line pairs from the global I/O line pairs in the upper leftward and the lower rightward block areas. That is, the third metal options may connect the local I/O line pairs to the global I/O line pairs regardless of activation mode of the memory device 300.

In the memory device 300, the block areas LUBA, LDBA, RUBA, RDBA may include multiplexers LGM1 through LGM20 to connect or disconnect the local I/O line pairs LIO1 through LIO5 to/from the global I/O line pairs GIO<0> through GIO<7> using the second and the third metal options.

Each of the multiplexers LGM1 through LGM20 may include one or more transistors having one electrode coupled to the local I/O line pairs and the other electrode coupled to the global I/O line pairs. The one electrode of the transistor may be connected or disconnected to/from the other electrode of the transistor by the second and the third metal options.

The upper leftward block area LUBA may include as many multiplexers as the lower leftward block area LDBA does. Likewise, the upper rightward block area RUBA may include as many multiplexers as the lower rightward block area RDBA does.

A pair of multiplexers LGM1 through LGM20 may correspond to each of the local I/O line pairs LIO1 through LIO5 for each of the upper and lower leftward block areas LUBA and LDBA and the upper and lower rightward block areas RUBA and RDBA.

The memory device 300 may include a plurality of fourth metal options or local-to-global connection points. The fourth metal options may be between the local I/O line pair LIO3 and the global I/O line pairs GIO<0> through GIO<7>. The fourth metal options may connect or disconnect the local I/O line pairs LIO3 to/from the global I/O line pairs GIO<0> through GIO<7> using the multiplexers LGM9 through LGM12. The fourth metal options may connect the local I/O line pairs to the global I/O line pairs regardless of activation mode of the semiconductor memory device 300. The multiplexers LGM9 through LGM12 may determine to transmit data of the memory blocks with reference to information indicating which of the memory blocks are activated.

The local I/O line pairs LIO1 and LIO2 in one of the upper and lower leftward block areas LUBA and LDBA may be connected to respective global I/O line pairs by corresponding metal contacts. The local I/O line pairs LIO4 and LIO5 in one of the upper and lower rightward block areas RUBA and RDBA, located diagonally opposite the connected leftward block area, may be connected to respective global I/O line pairs by metal contacts.

FIG. 2 is a flowchart for 2-row activation useful with embodiments of the present invention. Referring to FIG. 2, in operation 210, a plurality of local I/O line pairs located in upper leftward and rightward block areas may be connected to respective local I/O line pairs located in lower leftward and rightward block areas by a plurality of first metal options to form the local I/O line pairs LIO1 through LIO5.

In operation 220, the local I/O line pairs in one of the upper and lower leftward block areas may be connected to respective global I/O line pairs. In operation 230, the local I/O line pairs in the upper or lower rightward block area located in a diagonally opposite leftward block area may be connected to respective corresponding global I/O line pairs. For example, the connection of the multiplexers LGM1, LGM2, LGM5, LGM6, LGM9, and LGM10 may be interpreted as connecting the local I/O line pairs LIO1 and LIO2 and the global I/O line pairs GIO<0>, GIO<1>, GIO<2>, and GIO<3> which may be connected to the sources and drains of transistors (not shown) included in the multiplexers LGM1, LGM2, LGM5, LGM6, LGM9, and LGM10 using the metal options. At this time, the multiplexers LGM3, LGM4, LGM7, and LGM8 included in the lower leftward block area LDBA may not be connected.

Referring to FIG. 3, the multiplexers LGM11 and LGM12 in the lower leftward block area LDBA are connected when wordlines WL3 and WL4 that pass through the memory blocks MCB5, MCB6, MCB7, and MCB8 and the memory blocks MCB9, MCB10, MCB11, and MCB12 are activated. The operation of the memory device 300 when the wordlines that pass through the memory blocks MCB5, MCB6, MCB7, and MCB8 and the memory blocks MCB9, MCB10 MCB11, and MCB12 are activated will be described later in detail.

When the wordlines WL3 and WL4 that pass through the memory blocks MCB5, MCB6, MCB7, MCB8, MCB9, MCB10, MCB11, and MCB12 are not activated, data may not be transmitted to the multiplexers LGM11 and LGM12 in the lower leftward block area LDBA, thus achieving the same effect as when the multiplexers LGM3, LGM4, LGM7, LGM8, LGM11, and LGM12 in the lower leftward block area LDBA are not connected.

When the multiplexers LGM3, LGM4, LGM7, LGM8, LGM11, and LGM12 in the lower leftward block area LDBA are connected by the metal options, the multiplexers LGM1, LGM2, LGM5, and LGM6 are may not be connected by the metal options. In this case, the multiplexers LGM9 and LGM10 in the upper leftward block area LUBA may be connected when the wordlines WL3 and WL4 that pass through the memory blocks MCB5, MCB6, MCB7, and MCB8 and the memory blocks MCB9, MCB10, MCB11, and MCB12 are activated. The operation of the memory device 300 when the wordlines WL3 and WL4 that pass through the memory blocks MCB5, MCB6, MCB7, and MCB8 and the memory blocks MCB9, MCB10, MCB11, and MCB12 are activated will be described later in detail. The multiplexers LGM9 through LGM12 may be connected by the metal options to indicate which of the memory blocks MCB1 through MCB16 are activated in response to the activation of wordlines. This indication may be transmitted with data from the memory block information (not shown).

When the multiplexers LGM1, LGM2, LGM5, LGM6, LGM9, and LGM10 in the upper leftward block LUBA are connected, the multiplexers LGM15, LGM16, LGM19, and LGM20 in the lower rightward block area RDBA may be connected, but the multiplexers LGM13, LGM14, LGM17, and LGM18 in the upper rightward block area RUBA may not be connected.

Referring to FIG. 2, in operation 240, 2 wordlines are enabled. For example, when wordlines WL1 and WL2 are activated the memory device 300 operates in a 2-row activation mode, and a total of 2 wordlines, i.e., the wordline WL1 in the leftward block area LBA and the wordline WL2 in the rightward block area RBA, are enabled. Data in the memory blocks MCB1, MCB2, MCB3, and MCB4 may be activated in response to wordline WL1. The multiplexers LGM1, LGM2, LGM5, and LGM6 may be connected, but the multiplexers LGM3, LGM4, LGM7, and LGM8 may not be connected. Thus, the activated data is output from the multiplexers LGM1, LGM2, LGM5, and LGM6 via the global I/O line pairs GIO<0>, GIO<1>, GIO<2>, and GIO<3>. Likewise, when data in the memory blocks MCB13, MCB14, MCB15, and MCB16 is activated in response to wordline WL2, the multiplexers LGM15, LGM16, LGM19, and LGM20 may be connected, and the multiplexers LGM13, LGM14, LGM17, and LGM18 may not be connected, Thus, the activated data is output from the multiplexers LGM15, LGM16, LGM19, and LGM20 via the global I/O line pairs GIO<4>, GIO<5>, GIO<6>, and GIO<7>. In the above-described manner, the memory device 300 may convert between a 1-row activation configuration and a 2-row activation configuration.

The memory device 300 may also operate in a 2-row activation mode when multiplexers LGM3, LGM4, LGM7, LGM8, LGM11, and LGM12 in the lower leftward block area LDBA, instead of the multiplexers LGM1, LGM2, LGM5, LGM6, LGM9, and LGM10 in the upper leftward block area LUBA, are connected. Accordingly, the multiplexers LGM13, LGM14, LGM17, and LGM18 in the upper rightward block area RUBA, instead of the multiplexers LGM15, LGM16, LGM19, and LGM20 in the lower rightward block area RDBA, are connected.

When wordlines WL3 and WL4 that pass through and activate memory blocks MCB5, MCB6, MCB7, MCB8, MCB9, MCB10, MCB11, and MCB12, and that multiplexers LGM1, LGM2, LGM5, LGM6, LGM9, and LGM10 in the upper leftward block area LUBA and the multiplexers LGM15, LGM16, LGM19, and LGM20 in the lower rightward block area RDBA are connected, multiplexers LGM11 and LGM12 in the lower leftward block area LDBA are to indicate which of the memory blocks MCB1 through MCB16 is activated. In other words, the multiplexers LGM9, LGM10, LGM11, and LGM12 may be controlled according to the block information so that the multiplexers LGM9 and LGM10 receive data from the memory blocks MCB5 and MCB6, respectively, and the multiplexers LGM11 and LGM12 receive data from the memory blocks MCB11 and MCB12, respectively.

Figure 4:
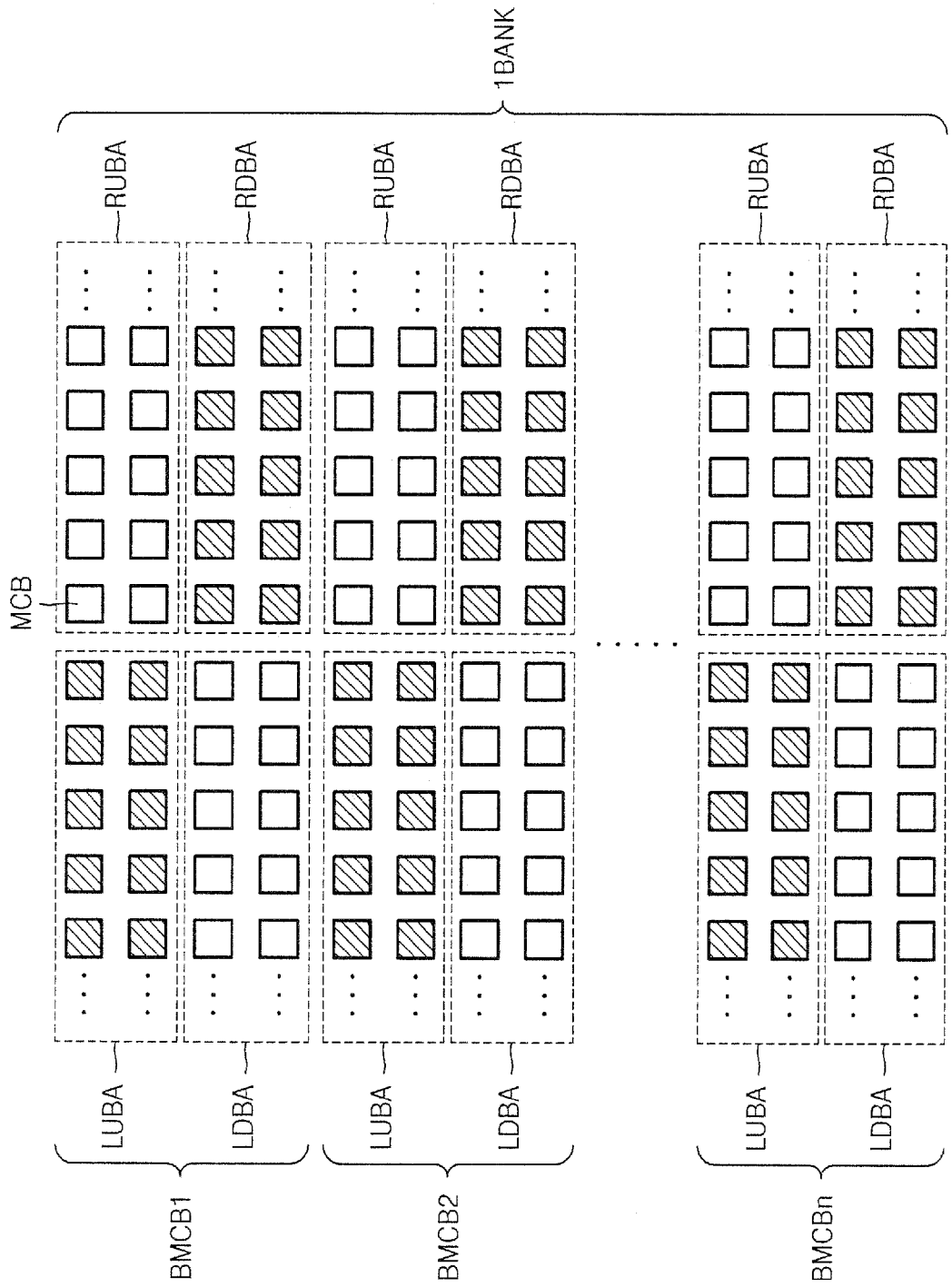
FIG. 4 is a diagram of a bank including a plurality of the memory devices shown in FIG. 3.

FIG. 4 is a diagram of a bank including a plurality of the memory devices shown in FIG. 3. Assuming that a leftward block area LBA and a rightward block area RBA constitute a basic block area, a bank comprises n basic block areas BMCB1 through BMCBn. For instance, when memory device 300 constitutes one eighth of a bank, an integer n indicating the number of basic block areas included in the memory device 300 may be 8. A plurality of memory blocks, therefore, may exist on the left side of the leftward block area of FIG. 3, and a plurality of memory blocks may exist on the right side of the rightward block area of FIG. 3. This may be applied to banks of the memory device 300 other than the bank shown in FIG. 3. For example, a plurality of multiplexers included in an upper leftward block area LUBA of the first basic block area BMCB1 and a plurality of multiplexers included in a lower rightward block area RDBA of the first basic block area BMCB1 may be connected by metal contacts while a plurality of multiplexers included in a lower leftward block area LDBA of the first basic block area BMCB1 and a plurality of multiplexers included in an upper rightward block area RUBA of the first block area may be disconnected.

When a plurality of multiplexers included in each of the second through n-th basic block areas BMCB2 through BMCBn are connected in the same manner as in the first basic block area BMCB1, the entire bank illustrated in FIG. 4 may have a 2-row activation configuration.

As described above, the semiconductor memory device according to the present invention is capable of selecting a 1-row activation configuration or a 2-row activation configuration. The 2-row activation method according to the present invention allows a semiconductor memory device to choose either a 1-row activation configuration or a 2-row activation configuration.

While the present invention has been particularly shown and described with reference to exemplary embodiments thereof, it will be understood by those of ordinary skill in the art that various changes in form and details may be made therein without departing from the spirit and scope of the present invention as defined by the following claims.

I claim the following:

1. A device comprising:
a memory block array including a plurality of memory blocks arranged in a row-column format;
a plurality of local inter-connectors to selectively couple upper local lines to lower local lines in corresponding rows of memory blocks; and
a plurality of local-to-global connection points to selectively couple the upper and lower local lines to one or more global lines in at least an upper left block area and a lower right block area of the memory block array, or in a lower left block area and an upper right block area of the memory block array.

2. The device of claim 1 where the local inter-connectors couple the upper local lines to lower local lines to form interconnected local lines in a 2 wordline row activation mode.

3. The device of claim 2 where the local-to-global connection points disconnect the interconnected local lines with one or more global lines in an upper left block area and a lower right block area of the memory block array, or in a lower left block area and an upper right block area of the memory block array in the 2 wordline row activation mode.

4. The device of claim 3 where the local-to-global connection points couple the interconnected local lines to one or more global lines, either in an lower left block area and a upper right block area of the memory block array, or in a upper left block area and an lower right block area of the memory block array in the 2 wordline row activation mode.

5. The device of claim 3 including
a plurality of wordlines, each coupled to one or more memory blocks in a corresponding row;
where one wordline is activated in a left block area of the memory block array and another wordline is activated in a right block area of the memory block array in the 2 wordline row activation mode.

6. The device of claim 1
where the local inter-connectors disconnect the upper local lines with the lower local lines in a 1 wordline row activation mode; and
where one or more of the local-to-global connection points couple at least one of the upper local lines and the lower local lines to one or more global lines in an upper left block area and a lower right block area of the memory block array, or in a lower left block area and an upper right block area of the memory block array in the 1 wordline row activation mode.

7. The device of claim 6 where one or more of the local-to-global connection points couple at least one of the upper local lines and/or lower local lines to one or more global lines, both in an upper left block area and a lower right block area of the memory block array, and in a lower left block area and an upper right block area of the memory block array in the 1 wordline row activation mode.

8. The device of claim 1 including a plurality of multiplexers, each including at least one of the local-to-global connection points to selectively couple the upper and lower local lines to the global lines.

9. The device of claim 8 where each of the block areas of the memory block array include at least two multiplexers to selectively couple the upper and lower local lines to the global lines.

10. The device of claim 8 where the multiplexers located near a left-right dividing line of the memory block array selectively couple the upper and lower local lines to the global lines to transmit information indicating which of the memory blocks are activated during at least one of the 1 wordline row activation mode and the 2 wordline row activation.

11. The device of claim 1 includes a bank having a plurality of basic block areas, where the memory block array corresponds to one basic block area.

12. A method comprising:
coupling one or more local lines in an upper portion of a memory block array to corresponding local lines in a lower portion of the memory block array;
selectively connecting the coupled local lines to one or more global lines in an upper left portion and a lower right portion of the memory block array, or in a lower left portion and an upper right portion of the memory block array; and
enabling multiple wordlines, at least one wordline coupled to a left portion of the memory block array and at least another wordline coupled to a right portion of the memory block array.

13. The method of claim 12 includes selectively disconnecting the coupled local lines with one or more global lines in the unconnected portions of the memory block array.

14. The method of claim 12 includes selectively connecting the coupled local lines to the global lines with one or more multiplexers.

15. The method of claim 14 where selectively connecting the coupled local lines to the global lines includes connecting one electrode of a transistor in the multiplexer to another electrode of the transistor with metal options.

16. The method of claim 12 includes connecting the coupled local lines to the global lines with metal contacts.

17. A device comprising:
   means for coupling one or more local lines in an upper portion of a memory block array to corresponding local lines in a lower portion of the memory block array;
   means for connecting the coupled local lines to one or more global lines in an upper left portion and a lower right portion of the memory block array, or in a lower left portion and an upper right portion of the memory block array; and
   means for enabling multiple wordlines, at least one wordline coupled to a left portion of the memory block array and at least another wordline coupled to a right portion of the memory block array.

18. The device of claim 17 includes means for disconnecting the coupled local lines with one or more global lines in the unconnected portions of the memory block array.

19. The device of claim 17 where the means for connecting is one or more metal contacts to connect one electrode of a transistor to another electrode of the transistor.

20. The device of claim 17 including
   means for separating the local lines with the local lines in a 1 wordline row activation mode; and
   means for coupling the local lines to the global lines in the 1wordline row activation mode.

* * * * *